US008554210B2

(12) United States Patent
Choi et al.

(10) Patent No.: US 8,554,210 B2
(45) Date of Patent: Oct. 8, 2013

(54) APPARATUS AND METHOD FOR STORING HAND OVER INFORMATION

(75) Inventors: Hyun Ho Choi, Daejeon (KR); In Sun Lee, Seoul (KR); Hyo Sun Hwang, Seoul (KR); Yoon Chae Cheong, Seongnam-si (KR); Tae In Hyon, Hwaseong-si (KR); Kyung Hun Jang, Suwon-si (KR); Young Soo Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1330 days.

(21) Appl. No.: 11/869,194

(22) Filed: Oct. 9, 2007

(65) Prior Publication Data

US 2008/0032696 A1 Feb. 7, 2008

(30) Foreign Application Priority Data

Aug. 3, 2007 (KR) .......................... 10-2007-0078268

(51) Int. Cl.
*H04W 4/00* (2009.01)
(52) U.S. Cl.
USPC ........... 455/434; 455/436; 455/512; 455/513; 455/514; 455/67.11
(58) Field of Classification Search
USPC ................. 455/434–444, 432.3, 67.11–67.16, 455/524–525, 509–514; 370/331
See application file for complete search history.

(56) References Cited

U.S. PATENT DOCUMENTS

| 5,265,263 | A | * | 11/1993 | Ramsdale et al. | 455/441 |
|---|---|---|---|---|---|
| 5,594,949 | A | * | 1/1997 | Andersson et al. | 455/437 |
| 5,854,981 | A | * | 12/1998 | Wallstedt et al. | 455/439 |
| 5,864,760 | A | * | 1/1999 | Gilhousen et al. | 455/442 |
| 5,893,033 | A | * | 4/1999 | Keskitalo et al. | 455/437 |
| 5,913,168 | A | * | 6/1999 | Moreau et al. | 455/441 |
| 5,915,221 | A | * | 6/1999 | Sawyer et al. | 455/437 |
| 5,974,320 | A | * | 10/1999 | Ward et al. | 455/437 |
| 6,192,244 | B1 | * | 2/2001 | Abbadessa | 455/436 |
| 6,300,905 | B1 | * | 10/2001 | Chen et al. | 342/458 |
| 6,415,149 | B1 | * | 7/2002 | Bevan et al. | 455/442 |
| 6,434,386 | B1 | * | 8/2002 | Lundborg | 455/436 |

(Continued)

FOREIGN PATENT DOCUMENTS

JP 2001-275142 10/2001
KR 10-2005-0042666 A 5/2005

(Continued)

OTHER PUBLICATIONS

English language abstract of Korean Patent Publication No. 2007-13929.

(Continued)

*Primary Examiner* — Sharad Rampuria
(74) *Attorney, Agent, or Firm* — NSIP Law

(57) ABSTRACT

An apparatus for storing handover information in a mobile communication system is provided. The apparatus includes an estimation unit configured to estimate a direction of arrival (DOA) of a received signal with respect to a first base station based on the received signal, the received signal being received from a terminal belonging to the first base station, and a storage unit to store the estimated DOA as handover information associated with a second base station when the terminal is handed over to the second base station.

36 Claims, 7 Drawing Sheets

(56) References Cited

U.S. PATENT DOCUMENTS

| | | | |
|---|---|---|---|
| 6,760,599 B1 * | 7/2004 | Uhlik | 455/525 |
| 7,006,798 B2 * | 2/2006 | Miyoshi et al. | 455/67.11 |
| 7,493,120 B2 * | 2/2009 | Kim et al. | 455/436 |
| RE40,984 E * | 11/2009 | Melero | 455/67.11 |
| 8,213,382 B2 * | 7/2012 | Sachs et al. | 370/331 |
| 8,301,145 B2 * | 10/2012 | Deivasigamani et al. | 455/436 |
| 2002/0119779 A1 * | 8/2002 | Ishikawa et al. | 455/437 |
| 2003/0125871 A1 * | 7/2003 | Cherveny et al. | 701/208 |
| 2004/0152480 A1 * | 8/2004 | Willars et al. | 455/513 |
| 2004/0259546 A1 * | 12/2004 | Balachandran et al. | 455/435.2 |
| 2005/0048974 A1 * | 3/2005 | Kim et al. | 455/436 |
| 2005/0176385 A1 | 8/2005 | Stern-Berkowitz et al. | |
| 2005/0176468 A1 | 8/2005 | Iacono et al. | |
| 2006/0223573 A1 | 10/2006 | Jalali | |
| 2007/0111746 A1 * | 5/2007 | Anderson | 455/522 |
| 2007/0266357 A1 * | 11/2007 | Kimata et al. | 716/6 |
| 2008/0160998 A1 * | 7/2008 | Jovanovic | 455/436 |

FOREIGN PATENT DOCUMENTS

| | | |
|---|---|---|
| KR | 2006-108774 | 10/2006 |
| KR | 2006-111712 | 10/2006 |
| KR | 10-677604 | 1/2007 |
| KR | 10-2007-0046482 A | 5/2007 |
| KR | 10-0732437 | 6/2007 |
| WO | WO 03/049409 A2 | 6/2003 |
| WO | WO 2005/076839 A2 | 8/2005 |
| WO | WO 2005/076970 A2 | 8/2005 |

OTHER PUBLICATIONS

Korean Office Action issued Apr. 26, 2013 with respect to counterpart Korean Application No. 10-2007-0078268 (5 pages, in Korean).

* cited by examiner

FIG. 3

| SECOND BASE STATION | DOA OF RECEIVED SIGANL | CQI |
|---|---|---|
| 1 | 20.1° | -1.0 |
| 1 | 20.2° | -1.2 |
| 1 | 20.5° | -0.9 |
| 1 | 19.3° | -1.0 |
| ⋮ | ⋮ | ⋮ |
| 1 | 20° | -1 |
| 2 | 60.4° | -2 |
| 2 | 60.2° | -1.8 |
| 2 | 59.9° | -2 |
| ⋮ | ⋮ | ⋮ |
| 2 | 60° | -2 |

APPARATUS AND METHOD FOR STORING HAND OVER INFORMATION

CROSS-REFERENCE TO RELATED APPLICATION

This application claims the benefit of Korean Patent Application No. 2007-78268, filed on Aug. 3, 2007 in the Korean Intellectual Property Office, the disclosure of which is incorporated herein by reference.

BACKGROUND OF THE INVENTION

1. Field of the Invention

Aspects relate to handover in a mobile communication system, and more particularly, to an apparatus and method that can generate handover information based on a signal received from a terminal, and broadcast the generated handover information to a particular region using beamforming.

2. Description of the Related Art

Generally, a mobile communication system divides the entire service providing area into a plurality of cells. A base station is provided in each of the plurality of cells to provide a service to terminals that are located in each of the cells.

A terminal that desires to use a service over the mobile communication system may communicate with the base station installed in each of the cells to use a desired service.

If a terminal uses a service using a particular base station and then moves to another cell in which another base station provides a service, the terminal can be handed over from the particular base station to the other base station and keep using the service.

To access another base station during communication with a currently accessing particular base station, the terminal must receive information about the other base station from the currently accessing particular base station.

The terminal receives from the particular base station information about at least one base station neighboring to the currently accessing particular base station. The terminal receives a reference signal from at least one other base station during communication with the particular base station, and compares the strength of the reference signal with another reference signal received from the particular base station. When the reference signal strength received from the other base station neighboring to the particular base station is greater than the reference signal strength received from the particular base station, the terminal performs a handover procedure to the other base station with a greater reference signal strength.

A terminal that is located in a particular region of a particular base station may be handed over to a base station associated with the particular region among a plurality of base stations neighboring to the particular base station. However, according to a conventional art, the terminal must receive information about all the base stations neighboring to the particular base station. Since the terminal needs to search all the neighboring base stations and receive reference signals from all the neighboring base stations, the terminal may consume a great amount of battery and also may spend unnecessarily long handover time.

SUMMARY OF THE INVENTION

Aspects provide an apparatus and method that can reduce an amount of handover information to be broadcasted to a terminal and thereby reduce a burden of a base station that broadcasts the handover information.

Other aspects provide an apparatus and method that can reduce a number of neighboring base stations that a terminal needs to search in order to perform handover, and thereby can enable the terminal to perform handover more quickly and can reduce a communication disconnection time.

Other aspects provide an apparatus and method that can reduce a number of neighboring base stations that a terminal needs to search in order to perform handover, and thereby can enable the terminal to operate for a longer time.

According to an aspect, there is provided an apparatus for storing handover information in a mobile communication system, the apparatus including: an estimation unit to estimate a direction of arrival (DOA) of a received signal with respect to a first base station based on the received signal, wherein the received signal is received from a terminal belonging to the first base station; and a storage unit to store the estimated DOA as handover information associated with a second base station when the terminal is handed over to the second base station.

According to another aspect, there is provided an apparatus for storing handover information in a mobile communication system, the apparatus including: a storage unit to store handover information about a particular region of a coverage of a first base station; and a transmission unit to broadcast the stored handover information to the particular region.

According to still another aspect, there is provided a method of storing handover information in a mobile communication system, the method including: estimating a DOA of a received signal with respect to a first base station based on the received signal, wherein the received signal is received from a terminal belonging to the first base station; and storing the estimated DOA as handover information associated with a second base station when the terminal is handed over to the second base station.

According to yet another aspect, there is provided a method of storing handover information in a mobile communication system, the method including: storing handover information about a particular region of a coverage of a first base station; and broadcasting the stored handover information to the particular region.

Additional aspects will be set forth in part in the description which follows and, in part, will be obvious from the description, or may be learned by practice of the invention.

BRIEF DESCRIPTION OF THE DRAWINGS

These and/or other aspects will become apparent and more readily appreciated from the following description of the embodiments, taken in conjunction with the accompanying drawings of which:

FIG. 3 is a table showing stored handover information and generated beamforming information according to an embodiment;

DETAILED DESCRIPTION OF EMBODIMENTS

Figure 1:
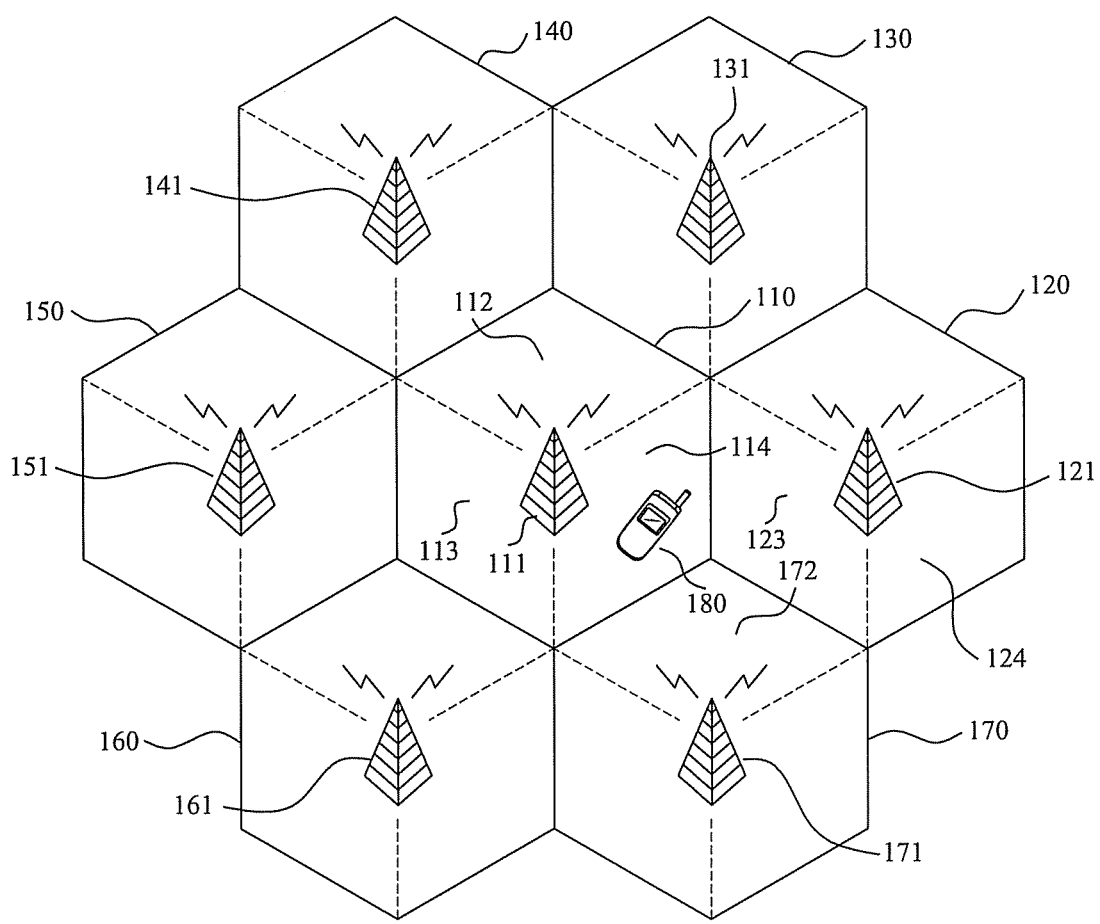
FIG. 1 shows a neighboring base station that a terminal searches to perform handover in a general mobile communication environment.

Reference will now be made in detail to general embodiments, examples of which are illustrated in the accompanying drawings, wherein like reference numerals refer to the like elements throughout. General embodiments are described below by referring to the figures.

FIG. 1 shows a neighboring base station that a terminal searches to perform handover in a general mobile communication environment. Hereinafter, a process in which the terminal searches a neighboring base station to perform handover will be described in detail with reference to FIG. 1. Referring to FIG. 1, a terminal 180 is currently located in a coverage 110 of a first base station 11, but the terminal 180 may move to any of a coverage 120 of a second base station 121, a coverage 130 of a third base station 131, a coverage 140 of a fourth coverage 141, a coverage 150 of a fifth base station 151, a coverage 160 of a sixth base station 161, and a coverage 170 of a seventh base station 171.

If the terminal 180 moves to the coverage 120, 130, 140, 150, 160, or 170 of the base station 121, 131, 141, 151, 161, or 171, neighboring to the coverage 110 of the first base station 111, the terminal 180 may be handed over from the first base station 111 to the other base station 121, 131, 141, 151, 161, or 171. The terminal 180 receives reference signals from the base stations 111, 121, 131, 141, 151, 161, and 171, and compares the strengths of the received reference signals. The terminal 180 may be handed over to a base station having the greatest reference signal strength.

To receive the reference signals, the terminal 180 must be aware of information about the other base stations 121, 131, 141, 151, 161, and 171 that neighbor to the current first base 111. The first base station 111 broadcasts information about the other base stations 121, 131, 141, 151, 161, and 171 to all the terminals that are located in the coverage 110 of the first base station 111.

However, the terminal 180 that is located in a particular region 114 of the coverage 110 of the first base station 111 has no choice but to move to a particular region 123 of the coverage 120 of the base station 121 or a particular region 172 of the coverage 170 of the base station 171, and thus handover is performed with respect to only the particular base station 121 or 171. The base stations 121 and 171 are neighboring base stations associated with the particular region 114.

Accordingly, it may be very ineffective to broadcast the same handover information to all the terminals that exist in the coverage 110 of the first base station 111 and thereby make all the terminals determine whether to perform handover with respect to all the base stations 121, 131, 141, 151, 161, and 171 neighboring to the coverage 110 of the first base station 111.

According to an aspect of the present invention, only handover information associated with the particular region 114 may be broadcasted to the terminal 180 that is located in the particular region 114 of the coverage 110 of the first base station 111, and the terminal 180 may search only a base station included in the handover information. Accordingly, a handover procedure may be simplified.

A handover information storing apparatus according to an aspect estimates a direction of arrival (DOA) of a signal that is received from the terminal 180 of the coverage 110 of the first base station 111. If the terminal 180 moves to the coverage 120, 130, 140, 150, 160, or 170 of the base station 121, 131, 141, 151, 161, or 171 and thereby handover occurs, the handover information storing apparatus stores the estimated DOA as handover information associated with the base station 121, 131, 141, 151, 161, or 171 to which the terminal 180 is handed over. Hereinafter, a base station to which the terminal 180 is handed over will be referred to as a second base station.

The handover information storing apparatus according to an aspect generates information about at least one of second base stations associated with the estimated DOA, as beamforming information, based on the handover information.

The handover information storing apparatus broadcasts the handover information to a particular region of the coverage 110 of the first base station 111 based on the beamforming information. The terminal 180 located in the particular region 114 receives the handover information, receives reference signals only from the second base stations 121 and 171 associated with the particular region, and performs a handover procedure with respect thereto.

Figure 2:
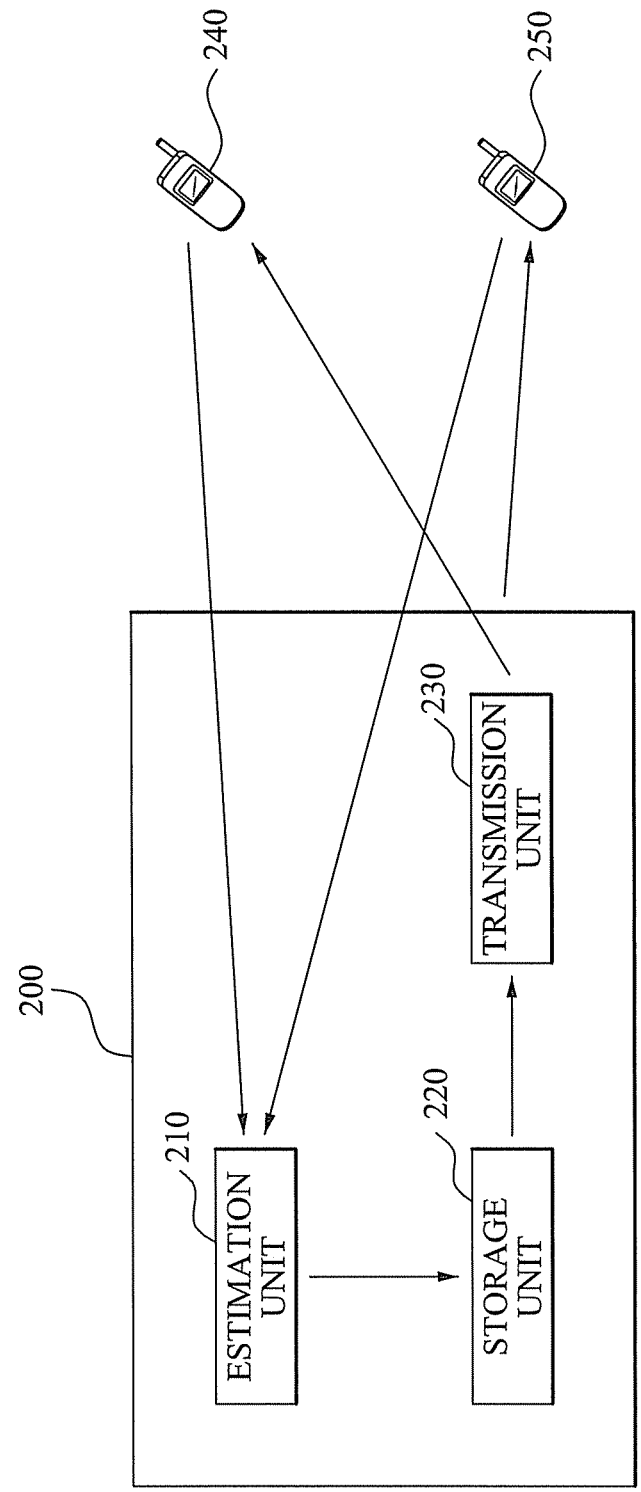
FIG. 2 shows a structure of a handover information storing apparatus storing handover information associated with a particular region of a coverage of a particular base station according to an embodiment.

FIG. 2 shows a structure of a handover information storing apparatus storing handover information 200 associated with a particular region of a coverage of a particular base station according to an embodiment. Hereinafter, an operation of the handover information storing apparatus 200 according to an aspect will be described in detail with reference to FIG. 2. The handover information storing apparatus 200 includes an estimation unit 210, a storage unit 220, and a transmission unit 230.

The estimation unit 210 estimates a DOA of each of received signals with respect to a first base station. The received signals are received from terminals 240 and 250 belonging to the first base station. The estimated DOA is associated with a particular region of a coverage of the first base station that includes the terminals 240 and 250.

According to an aspect, the first base station may receive a plurality of signals from the terminals 240 and 250 using a plurality of antennas. The estimation unit 210 may estimate the DOA based on a correlation between the plurality of signals that a received using the plurality of antennas.

According to an aspect, a scheme, such as MUltiple SIgnal Classification (MUSIC), Estimation of Signal Parameters via Rotational Invariant Techniques (ESPRIT), and the like, may be used to estimate the DOA based on the correlation.

When the terminals 240 and/or 250 are handed over to a second base station neighboring to the first base station, the storage unit 220 stores the estimated DOA as handover information associated with the second base station. The handover information is associated with a particular region of a coverage of the first base station in which the terminals 240 and/or 250 existed.

According to an aspect, the storage unit 220 may store wireless channel quality information of a wireless channel between the first base station and the terminals 240 and 250. The wireless channel information is received from the terminals 240 and 250, and is included in the handover information in association with the second base station.

According to an aspect, the wireless channel quality information may include at least one of a Received Signal Strength Indicator (RSSI) and a signal-to-interference and noise ratio (SINR), received from each of the terminals 240 and 250.

The first base station broadcasts a reference signal at a certain strength. The wireless channel quality information, such as RSSI and an SINR, which is generated from each of the terminals 240 and 250 with respect to the reference signal, is an approximate distance from the first base station to each of the terminals 240 and 250.

The handover information storing apparatus 200 according to an aspect may store the wireless channel quality information as handover information associated with the second base station. In this case, the handover information storing apparatus 200 may be aware whether the terminals 240 and 250 that belong to the first base station and are located in a particular distance of a particular direction are handed over to the second base station among at least one base station neighboring to the first base station.

The storage unit 220 according to an aspect may compare the handover information with the average of pre-stored second handover information associated with the second base station, and store the handover information depending on a result of the comparison. Depending on the comparison with the average of the second handover information, the storage unit 220 may not store handover information that exists within a statistically insignificant range and may store only handover information that exists within a statically significant range.

When a difference between the average and the handover information is within a predetermined range, the storage unit 220 may store the handover information in addition to the second handover information associated with the second base station.

Moreover, when the difference between the average and the handover information is within the predetermined range, the storage unit 220 may update the average based on the handover information.

According to an aspect, the storage unit 220 may calculate a correlation between handover information and the average of pre-stored second handover information associated with the second base station, and update the average of the pre-stored second handover information based on the calculated correlation.

The storage unit 220 may calculate the correlation between the handover information and the average of the pre-stored second handover information associated with the second base station. Based on the calculation, the storage unit 220 may not store handover information that exists in a statistically insignificant range and store only handover information that exists in a statistically significant range.

The storage unit 220 may calculate the correlation by, $$R = \frac{E[(X - \mu) \cdot (Y - \mu)]}{\sigma^2} \quad \text{[Equation 1]}$$

where R is the correlation between the handover information and the pre-stored second handover information associated with the base station to which the terminal is handed over, that is, the second base station, X is the pre-stored second handover information associated with the second base station, Y is handover information to be stored, E[·] is an average operator, μ is the average of the pre-stored second handover information associated with the second base station, and $\sigma^2$ is a variance value of the pre-stored second handover information associated with the second base station.

According to an aspect, when the correlation between the handover information and the pre-stored second handover information is greater than a predetermined value, the storage unit 220 may determine the correlation is within the statistically significant range, and store the handover information.

According to an aspect the storage unit 220 may calculate the correlation with respect to a DOA of a signal that is received from a terminal, or wireless channel quality information that is received from the terminal, and store the handover information based on the calculation.

According to an aspect, the storage unit 220 may generate information about at least one second base station as beamforming information based on the handover information. The information about the at least one second base station is associated with the DOA, and is information about the base station to which the terminal is handed over from the first base station.

The transmission unit 230 may broadcast information about the at least one second base station towards the DOA based on the beamforming information.

Each of the terminals 240 and 250 receives information about at least one base station associated with a particular region in which another terminal handed over from the first base station is located, and searches for a signal from only the at least one base station associated with the particular region, instead of searching all the base station neighboring to the first base station. As a number of base stations to be searched is decreased, power needed to search for signals for performing handover may be reduced, and a handover procedure may be simplified.

The storage unit 220 according to an aspect may generate beamforming information that includes spreading code information or frequency information about the at least one second base station associated with the particular region.

Each of the terminals 240 and 250 may readily receive a reference signal from the at least one second base station associated with the particular region, using frequency information at which the reference signal is broadcasted, or spreading code information of the reference signal.

FIG. 3 is a table showing stored handover information and generated beamforming information according to an embodiment. Hereinafter, beamforming information and handover information stored by a handover information storing apparatus according to an aspect will be described in detail with reference to FIG. 3. The handover information stored in the storage unit 220 may include at least one of a base station to which a terminal is handed over, that is, a second base station 310, a DOA of a received signal 320 that is received from the terminal, or wireless channel quality information (CQI) 330 of a wireless channel from the first base station to the terminals 240 and 250.

When storing the handover information, the storage unit 220 according to an aspect may further consider pre-stored second handover information 340 associated with the second base station 310. The storage unit 220 may store only statistically significant handover information by considering a correlation between the handover information and the pre-stored second handover information 340.

The storage unit 220 according to an aspect may generate beamforming information 350 and 370 based on the average of the pre-stored second handover information 340 associated with the second base station 310. The transmission unit 230 may broadcast the handover information based on the beamforming information 350 and 370.

The storage unit 220 according to an aspect may divide the pre-stored second handover information based on at least one second base station to, and store the divided second handover information. According to an aspect, the storage unit 220 may generate the beamforming information 350 and 370 based on the estimated DOA of the received signal received 330.

Each of the beamforming information 350 and 370 shown in FIG. 3 includes information about one second base station based on a particular DOA, such as 20° and 60°. However, according to an aspect, the beamforming information 350 and 370 generated by the storage unit 220 may include information about a plurality of second base stations with respect to a particular DOA.

The wireless channel quality information 330 included in the beamforming information 350 and 370 is associated with a distance between the first base station. Accordingly, the transmission unit 230 may control the strength of a signal that includes the beamforming information 350 and 370 based on the wireless channel quality information 330. The transmission unit 230 may control the strength of the signal that broadcasts the beamforming information 350 and 370, and thereby control the range of the beamforming information 350 and 370.

Figure 4:
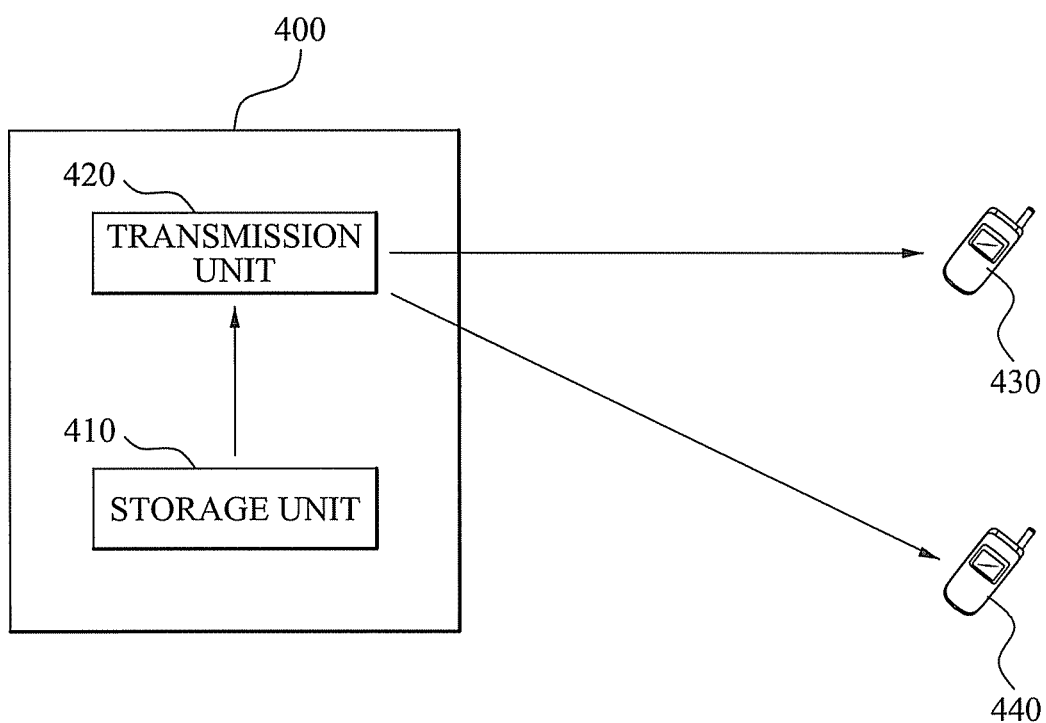
FIG. 4 shows a structure of a handover information storing apparatus broadcasting handover information to each region of a coverage of a particular base station according to an embodiment.

FIG. 4 shows a structure of a handover information storing apparatus 400 broadcasting handover information to each region of a coverage of a particular base station according to an embodiment. Hereinafter, an operation of the handover information storing apparatus 400 will be described in detail with reference to FIG. 4. The handover information storing apparatus 400 includes a storage unit 410 and a transmission unit 420.

The storage unit 410 stores handover information about a particular region of a coverage of a first base station, and the transmission unit 420 broadcasts the stored handover information to the particular region.

According to an aspect, the handover information may include information about at least one second base station which is associated with each region of the coverage of the first base station, and to which a terminal is handed over from the first base station. The information about the at least one base station may include spreading code information or frequency information about the at least one second base station. The terminal may search for a reference signal that is transmitted from the at least one second base station, using the spreading code information or the frequency information about the at least one second base station.

The storage unit 410 according to an aspect divides the coverage of the first base station into a plurality of regions, and stores handover information for each of the regions. The transmission unit 420 may broadcast the stored handover information to each of the regions.

The transmission unit 420 according to an aspect may perform beamforming with respect to the handover information based on a direction of each of the regions with respect to the first base station, or wireless channel quality information associated with each of the regions. Terminals 430 and 440 located in the regions respectively do not receive unnecessary handover information corresponding to other regions.

According to an aspect, the wireless channel quality information may include at least one of an RSSI and an SINR, associated with each of the regions. The wireless channel quality information is associated with a distance from the first base station when the terminals 430 and 440 handed over from the first base station to another base station. Specifically, if there is a relatively greater difference between wireless channel quality information that is measured by the terminals 430 and 440 based on a reference signal from the first base station and wireless channel quality information included in handover information that is received from the first base station, it may be less probable for the terminals 430 and 440 to perform handover. Accordingly, the terminals 430 and 440 may not search for a reference signal that is transmitted from at least one second base station, associated with a particular region of the terminals 430 and 440. Also, the terminals 430 and 440 may significantly increase a searching period. If wireless channel quality information measured by the terminals 430 and 440 approaches wireless channel quality information included in handover information received from the first base station, it may be highly possible for the terminals 430 and 440 to perform handover. Accordingly, the terminals 430 and 440 may reduce a searching period for which the terminals 430 and 440 search for a reference signal that is transmitted from at least one second base station associated with the particular region of the terminals 430 and 440. The terminals 430 and 440 may compare the measured handover information and the handover information received from the first base station, and control a searching period for searching for a reference signal that is transmitted from the second base station associated with the particular region of the terminals 430 and 440. Accordingly, it is possible to reduce power consumption needed to search for the reference signal.

The transmission unit 420 according to an aspect may periodically broadcast the handover information to the particular region.

Figure 5:
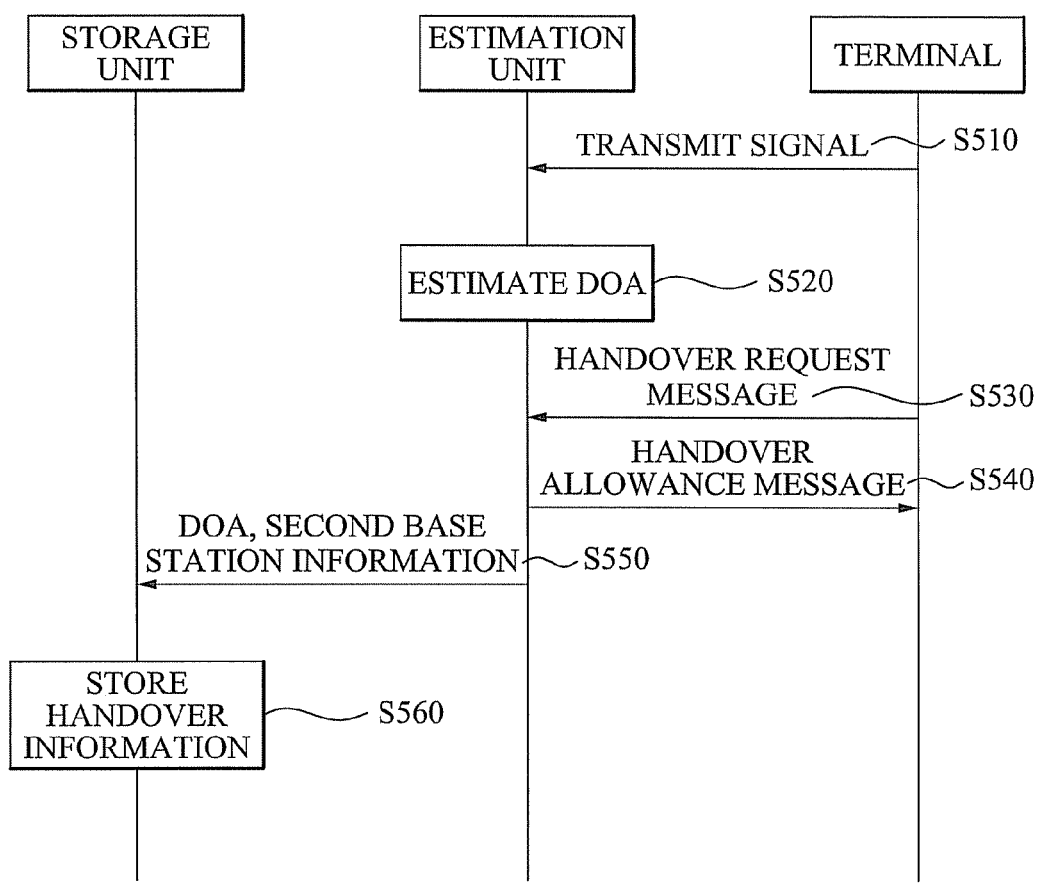
FIG. 5 is a flowchart showing a method of storing handover information according to an embodiment.

FIG. 5 is a flowchart showing a method of storing handover information according to an embodiment. Hereinafter, a method of storing handover information will be described in detail with reference to FIG. 5.

Referring to FIG. 5, in operation S510, a first base station receives a signal from a terminal belonging to the first base station.

According to an aspect, the first base station may receive a signal from the terminal using a plurality of antennas and generate a plurality of received signals.

In operation S520, the estimation unit estimates a DOA of the signal with respect to the first base station based on the received signal.

According to an aspect, the first base station may estimate the DOA based on a correlation between the plurality of received signals that are received using the plurality of antennas.

In operation S530, the terminal transmits a handover request message to the first base station. In operation S540, the first base station transmits a handover allowance message in response to the handover request message.

The terminal that is connected to the first base station may be handed over to another base station that is associated with a particular region of the terminal, that is, a second base station.

According to an aspect, the handover request message from the terminal may include wireless channel quality information that is measured by the terminal. The wireless channel quality information may include at least one of an RSSI and an SINR, received from the terminal.

In operation S550, the estimation unit transmits the estimated DOA to a storage unit. In operation S560, the storage unit may store the estimated DOA as handover information in association with the second base station.

According to an aspect, the storage unit may store the wireless channel quality information by including the same in association with the second base station.

According to an aspect, operation S560 may include an operation of comparing the handover information with the average of pre-stored second handover information in association with the second base station. The storage unit may store the handover information depending on a result of the comparison.

According to an aspect, when a difference between the handover information and the average is within a predetermined range as a result of the comparison, the storage unit may store the handover information in addition to the pre-stored second handover information.

According to an aspect, when the difference between the handover information and the average is within the predetermined range, the average may be updated based on the handover information.

According to an aspect, the storage unit may calculate the correlation between the handover information and the pre-stored second handover information, and update the average of the pre-stored second handover information based on the calculated correlation.

According to an aspect, the correlation may be calculated by $$R = \frac{E[(X - \mu) \cdot (Y - \mu)]}{\sigma^2} \quad \text{[Equation 2]}$$

where R is the correlation between the handover information and the pre-stored second handover information associated with the base station to which the terminal is handed over, that is, the second base station, X is the pre-stored second handover information associated with the second base station, Y is handover information to be stored, E[ ] is an average operator, $\mu$ is the average of the pre-stored second handover information associated with the second base station, and $\sigma^2$ is a variance value of the pre-stored second handover information associated with the second base station. According to an aspect, the correlation may be calculated according to the above Equation 1.

According to an aspect, when the correlation between the handover information and the pre-stored second handover information is greater than a predetermined value, the storage unit may determine the correlation is within a statistically significant range, and store the handover information.

Since only statistically significant information is additionally stored based on the pre-stored second handover information, the store unit may collect more reliable information as handover information.

According to an aspect, the storage unit may calculate the correlation with respect to the estimated DOA of the signal that is received from the terminal, or the wireless channel quality information that is received from the terminal, and store the handover information based on the calculation.

Operation S560 may include an operation of generating information about at least one second base station associated with the DOA, as beamforming information based on the handover information.

According to an aspect, in the generating, the beamforming information may be generated by including frequency information or spreading code information about the at least one second base station associated with the DOA.

According to an aspect, operation S560 may include an operation of broadcasting the information about the at least one second base station associated with the DOA towards the DOA, based on the beamforming information.

A second terminal that is located in a particular region associated with the DOA may receive the information about the at least one second base station associated with the DOA, and perform handover based on the information. The second terminal searches a reference signal with respect to only the at least one base second station associated with the DOA, instead of searching for reference signals from all the base stations neighboring to the first base station. Accordingly, handover may be quickly performed and thereby power consumption of the terminal may be reduced.

Figure 6:
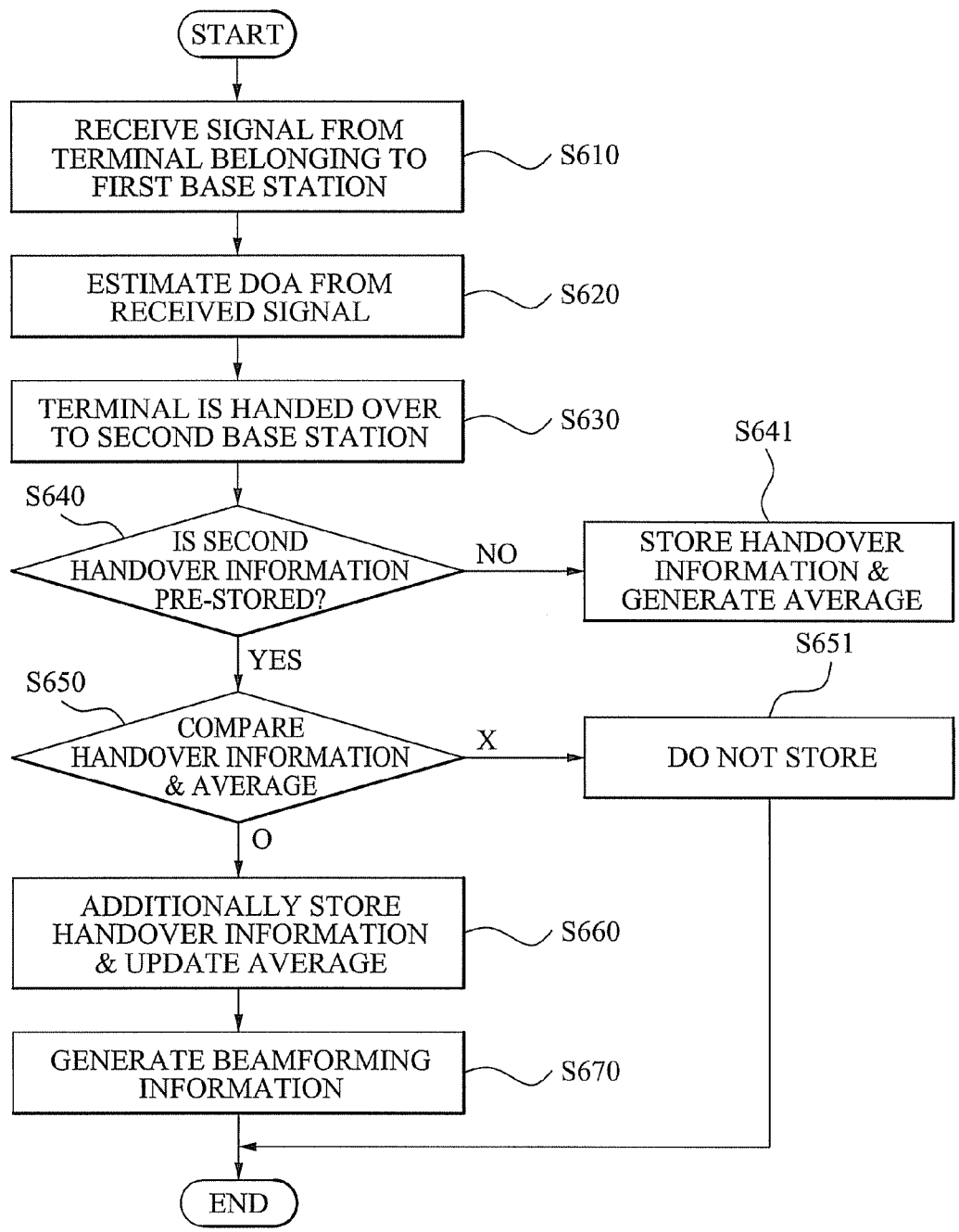
FIG. 6 is a flowchart showing a method of storing handover information based on pre-stored second handover information according to an embodiment.

FIG. 6 is a flowchart showing a method of storing handover information based on pre-stored second handover information associated with a second base station according to an embodiment. Hereinafter, a method of storing handover information will be described in detail with reference to FIG. 6.

Referring to FIG. 6, in operation S610, a signal is received from a terminal belonging to a first base station. The signal is generally transmitted from a terminal to the first base station. The signal may be a data transmission signal, or may be a control signal to transmit 'a handover request message'.

According to an aspect, the first base station may receive a signal from the terminal using a plurality of antennas, and generate a plurality of received signals.

In operation S620, a DOA of the signal received from the terminal is estimated.

According to an aspect, the DOA of the received signal may be estimated based on a correlation between the plurality of received signals.

In operation S630, the terminal is handed over from the first base station to a second base station associated with a particular region of the terminal, among at least one second base station neighboring to the first base station, and is connected to the second base station associated with the particular region.

According to an aspect, the first base station may receive wireless channel quality information from the terminal during the handover procedure. The wireless channel quality information may include at least one of an RSSI and an SINR, measured by the terminal.

In operation S640, in order to store the estimated DOA or the received wireless channel quality information as handover information associated with the second base station, it is determined whether second handover information associated with the second base station is pre-stored. If the second handover information is not stored as a result of the determination, the handover information may be stored in association with the second base station and the average of the handover information may be generated in operation S641.

If the second handover information associated with the second base station is stored, the handover information is compared with the second handover information in operation S650.

If there is a relatively less correlation between the handover information and the pre-stored second handover information, or if there is a relatively great difference between the handover information and the pre-stored second handover information, the handover information is statistically insignificant. Accordingly, in operation S651, the handover information may not be stored.

If there is a relatively great correlation between the handover information and the pre-stored second handover information, or if there is a relatively less difference between the handover information and the pre-stored second handover information, the handover information may be stored in addition to the second handover information and the average of the second handover information may be updated based on the handover information in operation S660.

According to an aspect, the correlation may be calculated by $$R = \frac{E[(X - \mu) \cdot (Y - \mu)]}{\sigma^2} \quad \text{[Equation 3]}$$

where R is the correlation between the handover information and the pre-stored second handover information associated with the base station to which the terminal is handed over, that is, the second base station, X is the pre-stored second handover information associated with the second base station, Y is handover information to be stored, E[ ] is an average operator, $\mu$ is the average of the pre-stored second handover information associated with the second base station, and $\sigma^2$ is a variance value of the pre-stored second handover information associated with the second base station.

According to an aspect, when the correlation between the handover information and the pre-stored second handover information is greater than a predetermined value, it may be determined the correlation is within a statistically significant range.

If there exists the correlation between the handover information and the pre-stored second handover information, the handover information may be stored in addition to the pre-stored second handover information, and the pre-stored second handover information may be updated based on the handover information.

According to an aspect, the correlation may be calculated with respect to the estimated DOA of the signal received from the terminal, or wireless channel quality information received from the terminal. Depending on a result of the calculation, the handover information may be stored.

In operation S670, information about at least one base second station associated with the DOA may be generated as beamforming information based on the handover information. Information about the at least one second base station may include spreading code information or frequency information about the at least one second base station associated with the DOA.

According to an aspect, information about the at least one second base station may be broadcasted towards the DOA based on the beamforming information. The second terminal is located in a particular region associated with the DOA in a coverage of the first base station, and may readily search for a reference signal from the at least one second base station using the broadcasted information about the at least one second base station.

Figure 7:
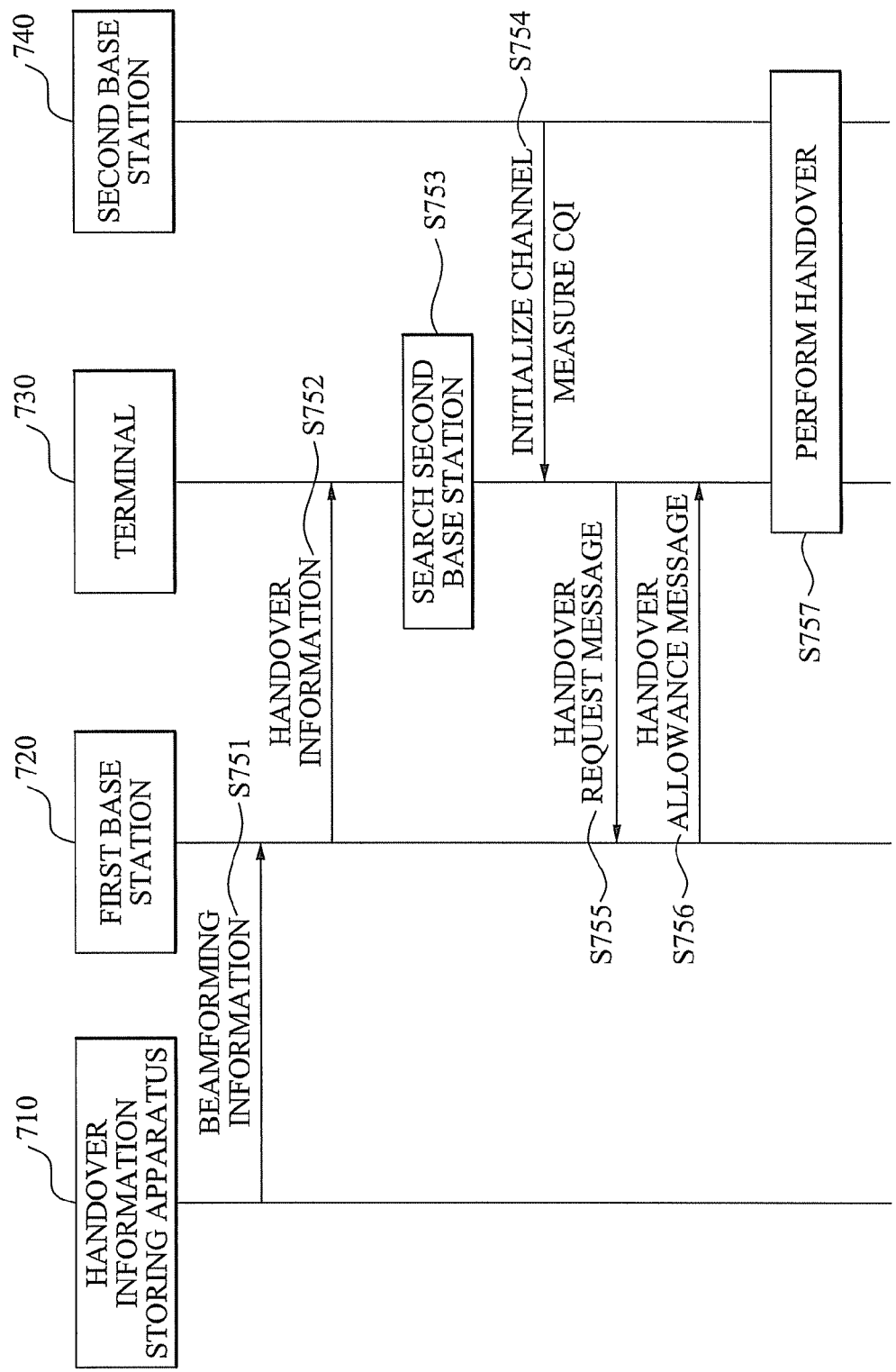
FIG. 7 is a flowchart showing a method of performing a handover procedure using handover information associated with a particular region of a coverage of a particular base station according to an embodiment.

FIG. 7 is a flowchart showing a method of performing a handover procedure using handover information associated with a particular region of a coverage of a particular base station according to an embodiment. Hereinafter, a method of performing a handover procedure using handover information associated with the particular region will be described in detail with reference to FIG. 7.

Referring to FIG. 7, in operation S751, beamforming information stored in a handover information storing apparatus 710 is transmitted to a first base station 720.

In operation S752, the first base station 720 broadcasts the handover information towards a particular direction associated with the particular region of a coverage of the first base station 720 using the beamforming information.

According to an aspect, the first base station 720 may broadcast the handover information using a plurality of antennas that are installed in the first base station 720.

In operation S753, a terminal 730 belonging to the first base station 720 searches at least one second base station 740 associated with the particular region of the terminal 730 of the coverage of the first base station 720, based on the handover information.

Instead of searching all the base stations neighboring to the first base station 720, the terminal 730 searches only the second base station 740 associated with the particular region. Accordingly, power consumption for searching may be reduced and a searching process may be quickly performed.

In operation S754, the terminal 730 synchronizes the found second base station 740 and time, and generates wireless channel quality information among the first base station 720, the terminal 730, and the second base station 740, using a reference signal that is received from the second base station 740. The wireless channel quality information may include at least one of an RSSI and an SINR.

The terminal 730 compares wireless channel quality information between the first base station 720 and the terminal 730, and another wireless channel quality information between the terminal 730 and the second base station 740. In this case, if the wireless channel quality information between the terminal 730 and the second base station 740 is better than the wireless channel quality information between the first base station 720 and the terminal 730, the terminal 730 transmits a handover request message to the first base station 720 in operation S755. The handover request message relates to a request for handover from the first base station 720 to the second base station 740.

In operation S756, the first base station S720 transmits a handover allowance message to the terminal 730 in response to the handover request message. In operation S757, the terminal 730 is handed over from the first base station 720 to the second base station 740.

Aspects can also be embodied as computer-readable codes on a computer-readable recording medium and can be realized in a common digital computer executing the program using a computer-readable recording medium. The computer-readable recording medium is any data storage device that can store data which can be thereafter read by a computer system. Examples of the computer-readable recording medium include read-only memory (ROM), random-access memory (RAM), CD-ROMs, magnetic tapes, floppy disks, optical data storage devices, and a computer data signal embodied in a carrier wave comprising a compression source code segment and an encryption source code segment (such as data transmission through the Internet). The computer-readable recording medium can also be distributed over network coupled computer systems so that the computer-readable code is stored and executed in a distributed fashion. Moreover, the hard disk drive can be used with a computer, can be a portable drive, and/or can be used with a media player.

According to aspects, it is possible to reduce an amount of handover information to be broadcasted to a terminal and thereby reduce a burden of a base station that broadcasts the handover information.

Also, according to aspects, it is possible to reduce a number of neighboring base stations that a terminal needs to search in order to perform handover. Therefore, the terminal may perform handover more quickly and a communication disconnection time may be reduced.

Also, according to aspects, it is possible to reduce a number of neighboring base stations that a terminal needs to search in order to perform handover. Therefore, the terminal may operate for a longer time.

Although a few embodiments have been shown and described, it would be appreciated by those skilled in the art that changes may be made to these embodiments without departing from the principles and spirit of the invention, the scope of which is defined by the claims and their equivalents.

What is claimed is:

1. An apparatus for storing handover information in a mobile communication system, the apparatus comprising:
   an estimation unit configured to estimate a direction of arrival (DOA) of a received signal with respect to a first base station based on the received signal, the received signal being received from a terminal served by the first base station; and
   a storage unit configured to:
   compare the estimated DOA with an average of pre-stored handover information associated with a second base station; and store, when the terminal is handed over to the second base station and depending on the result of the comparison, the estimated DOA with the handover information.

2. The apparatus as claimed in claim 1, wherein the estimation unit is further configured to:
receive a plurality of signals using a plurality of antennas; and
estimate the DOA based on a correlation between the plurality of received signals.

3. The apparatus as claimed in claim 1, wherein the storage unit is further configured to store wireless channel quality information of a wireless channel between the first base station and the terminal, and
wherein the wireless channel quality information is received from the terminal and is included in the handover information in association with the second base station.

4. The apparatus as claimed in claim 3, wherein the wireless channel quality information includes at least one of a Received Signal Strength Indicator (RSSI) and a signal-to-interference and noise ratio (SINR) that is received from the terminal.

5. The apparatus as claimed in claim 1, wherein, when the difference between the average of the pre-stored handover information and the estimated DOA is within a predetermined range, the storage unit stores the estimated DOA with the handover information.

6. The apparatus as claimed in claim 1, wherein the storage unit is further configured to:
calculate a correlation between the estimated DOA and the pre-stored handover information associated with the second base station; and
store the estimated DOA with the handover information based on the calculated correlation.

7. The apparatus as claimed in claim 1, further comprising:
a transmission unit configured to broadcast information about at least one second base station of a plurality of second base stations towards the DOA based on beamforming information, the beamforming information being based on the handover information, the second base station being one of the plurality of second base stations,
wherein the storage unit is further configured to generate the information about the at least one second base station as the beamforming information, and
wherein the information about the at least one second base station is associated with the DOA.

8. The apparatus as claimed in claim 7, wherein the beamforming information includes at least one of frequency information and spreading code information about the at least one second base station.

9. An apparatus for storing handover information in a mobile communication system, the apparatus comprising:
a storage unit configured to:
compare the direction of arrival (DOA) of a received signal with an average of pre-stored handover information regarding a first base station's particular region of coverage, and
store, depending on the result of the comparison, the DOA with the handover information; and
a transmission unit configured to broadcast the stored handover information to the particular region.

10. An apparatus for storing handover information in a mobile communication system, the apparatus comprising:
a storage unit configured to:
divide coverage of a first base station into a plurality of regions,
compare, for each region, the direction of arrival (DOA) of a signal received from the region with an average of pre-stored handover information about the region, and
store, depending on the result of the respective comparison, the respective DOA with the handover information about the region; and
a transmission unit configured to:
broadcast the stored handover information for each of the regions, respectively; and
perform beamforming with respect to the handover information based on a direction of each of the regions with respect to the first base station or wireless channel quality information associated with each of the regions.

11. The apparatus as claimed in claim 10, wherein the wireless channel quality information includes at least one of a Received Signal Strength Indicator (RSSI) and a signal-to-interference and noise ratio (SINR) that is associated with each of the regions.

12. The apparatus as claimed in claim 10, wherein the transmission unit is further configured to periodically broadcast the handover information.

13. A method of storing handover information in a mobile communication system, the method comprising:
estimating a direction of arrival (DOA) of a received signal with respect to a first base station based on the received signal, the received signal being received from a terminal served by the first base station;
comparing the estimated DOA with an average of pre-stored handover information associated with a second base station; and
storing, when the terminal is handed over to the second base station and depending on the result of the comparison, the estimated DOA with the handover information.

14. The method as claimed in claim 13, wherein the estimating of the DOA comprises:
receiving a plurality of signals using a plurality of antennas; and
estimating the DOA based on a correlation between the plurality of received signals.

15. The method as claimed in claim 13, wherein the storing of the estimated DOA further comprises storing wireless channel quality information of a wireless channel between the first base station and the terminal, the wireless channel quality information being received from the terminal and included in the handover information in association with the second base station.

16. The method as claimed in claim 15, wherein the storing of the wireless channel quality information comprises storing at least one of a Received Signal Strength Indicator (RSSI) and a signal-to-interference and noise ratio (SINR) that is received from the terminal.

17. The method as claimed in claim 13, wherein the estimated DOA is stored with the handover information when the result of the comparison includes a difference between the average of the pre-stored handover information and the handover information that is within a predetermined range.

18. The method as claimed in claim 13, further comprising:
updating the average of the pre-stored handover information to include the estimated DOA handover information when the result of the comparison includes a difference between the average of pre-stored handover information and the handover information that is within a predetermined range.

19. The method as claimed in claim 13, wherein the storing of the estimated DOA further comprises:

calculating a correlation between the estimated DOA and the pre-stored handover information associated with the second base station; and storing the estimated DOA with the handover information based on the calculated correlation.

20. The method as claimed in claim 13, wherein the storing of the estimated DOA comprises:

calculating a correlation between the estimated DOA and pre-stored handover information associated with the second base station; and updating an average of the pre-stored handover information associated with the second base station based on the correlation.

21. The method as claimed in claim 13, wherein the storing of the estimated DOA further comprises:

generating information about at least one second base station of a plurality of second base stations as beamforming information based on the handover information, the second base station being one of the plurality of second base stations, the information about the at least one second base station being associated with the DOA.

22. The method as claimed in claim 21, wherein the generating of the information comprises:

generating the beamforming information that includes spreading code information or frequency information about the at least one second base station.

23. The method as claimed in claim 21, further comprising:

broadcasting the information about the at least one second base station towards the DOA based on the beamforming information.

24. A method of storing handover information in a mobile communication system, the method comprising:

comparing the direction of arrival of a received signal with an average of pre-stored handover information regarding a first base station's particular region of coverage;

storing, depending on the result of the comparison, the DOA with the handover information; and broadcasting the stored handover information to the particular region.

25. A method of storing handover information in a mobile communication system, the method comprising:

dividing coverage of a first base station into a plurality of regions;

comparing, for each region of, the direction of arrival (DOA) of a signal received from the region with an average of pre-stored handover information about the region;

storing, depending on the result of the result of the respective comparison, the respective DOA with the handover information about the region; and broadcasting the stored handover information for each of the regions respectively, the broadcasting of the stored handover information comprising performing beamforming with respect to the handover information based on a direction of each of the regions with respect to the first base station or wireless channel quality information associated with each of the regions.

26. The method as claimed in claim 25, wherein the wireless channel quality information includes at least one of a Received Signal Strength Indicator (RSSI) and a signal-to-interference and noise ratio (SINR) that is associated with each of the regions.

27. The method as claimed in claim 25, wherein the handover information includes information about at least one second base station associated with each of the regions.

28. The method as claimed in claim 27, wherein information about the at least one second base station includes spreading code information or frequency information about the at least one second base station.

29. The method as claimed in claim 25, wherein the broadcasting of the stored handover information comprises periodically broadcasting the stored handover information.

30. The apparatus as claimed in claim 1, wherein, when the difference between the average of the pre-stored handover information and the estimated DOA is within a predetermined range, the storage unit updates the average of pre-stored handover information to include the estimated DOA.

31. The apparatus as claimed in claim 6, wherein the storage unit is further configured to calculate the correlation by the equation $$R = \frac{E[(X-\mu)\cdot(Y-\mu)]}{\sigma^2},$$

where R is the correlation between the estimated DOA and the pre-stored handover information associated with the second base station, X is the pre-stored handover information associated with the second base station, Y is the estimated DOA, E[ ] is an average operator, $\mu$ is the average of the pre-stored handover information associated with the second base station, and $\sigma^2$ is a variance value of the pre-stored handover information associated with the second base station.

32. The apparatus as claimed in claim 30, wherein when the difference exceeds the predetermined range, the average of pre-stored handover information remains unchanged.

33. The apparatus as claimed in claim 9, wherein the handover information includes at least one of spreading code information and frequency information regarding a second base station.

34. The apparatus as claimed in claim 10, wherein the handover information includes at least one of spreading code information and frequency information regarding a second base station.

35. The method as claimed in claim 24, wherein the handover information includes at least one of spreading code information and frequency information regarding a second base station.

36. The method as claimed in claim 25, wherein the handover information includes at least one of spreading code information and frequency information regarding a second base station.

* * * * *